US008803210B2

United States Patent
Jung et al.

(10) Patent No.: US 8,803,210 B2
(45) Date of Patent: Aug. 12, 2014

(54) X-RAY DETECTOR

(75) Inventors: Kwan-Wook Jung, Yongin (KR);
Dong-Hyuk Kim, Yongin (KR);
Woo-Jae Lim, Yongin (KR); Jea-Eun Ryu, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 494 days.

(21) Appl. No.: 12/975,568

(22) Filed: Dec. 22, 2010

(65) Prior Publication Data
US 2011/0180889 A1 Jul. 28, 2011

(30) Foreign Application Priority Data
Jan. 27, 2010 (KR) .................. 10-2010-0007488

(51) Int. Cl.
*H01L 31/062* (2012.01)
*H01L 31/113* (2006.01)
(52) U.S. Cl.
USPC ............. 257/292; 257/59; 257/72; 257/444; 257/E27.111
(58) Field of Classification Search
USPC .................................... 257/292, E27.111
See application file for complete search history.

(56) References Cited

U.S. PATENT DOCUMENTS

| 7,633,091 B2 | 12/2009 | Lan |
| 2004/0203202 A1 | 10/2004 | Shih |
| 2009/0032892 A1 | 2/2009 | Hsiao et al. |
| 2009/0152472 A1 | 6/2009 | Kim et al. |
| 2010/0059804 A1* | 3/2010 | Hayashi et al. ............... 257/292 |

FOREIGN PATENT DOCUMENTS

| KR | 10-2004-0032603 A | 4/2004 |
| KR | 10-2004-0050946 A | 6/2004 |
| KR | 10-2006-0014193 A | 2/2006 |
| KR | 10-0796754 B1 | 1/2008 |
| KR | 10-2009-0010493 A | 1/2009 |

\* cited by examiner

*Primary Examiner* — Hsin-Yi Hsieh
(74) *Attorney, Agent, or Firm* — Robert E. Bushnell, Esq.

(57) ABSTRACT

An X-ray detector includes a substrate; a gate line that is extended in a first direction on the substrate; a gate electrode that is extended from the gate line; a semiconductor layer that is positioned on the gate electrode; a source electrode and drain electrode that are positioned on the semiconductor layer; a lower electrode that is extended from the drain electrode; a photodiode that is positioned on the lower electrode; a first insulation layer that is positioned on the source electrode and the drain electrode and that includes a first opening that exposes the source electrode; and a data line that is extended in a second direction intersecting a first direction on the first insulation layer to intersect the gate line with the first insulation layer interposed between the data line and the gate line, and the data line being electrically connected to the source electrode through the first opening.

16 Claims, 4 Drawing Sheets

X-RAY DETECTOR

CLAIM OF PRIORITY

This application makes reference to, incorporates the same herein, and claims all benefits accruing under 35 U.S.C. §119 from an application earlier filed in the Korean Intellectual Property Office on the 27 Jan. 2010 and there duly assigned Serial No. 10-2010-0007488.

BACKGROUND OF THE INVENTION

1. Field of the Invention

The described technology relates generally to an X-ray detector, and more particularly, to an X-ray detector including a thin film transistor and a photodiode.

2. Description of the Related Art

X-ray detectors have been developed as radiation transmission apparatus in order to provide images and pictures for the medical industry. Detective quantum efficiency (DQE) is one of the parameters used to determine the performance of X-ray detectors.

The above information is disclosed in this Background discussion only for enhancement of an understanding of the field of the described technology and may therefore, contain information that is not itself prior art or art that is already known in this country to a person of ordinary skill in the art.

SUMMARY OF THE INVENTION

It is therefore one object for the present invention to provide an improved X-ray detector with an enhanced detective quantum efficiency (DQE) attained through minimization of the occurrence of electrical noise in a wire or lead or electrical trance or electrical conductor or electrode.

An exemplary embodiment provides an X-ray detector may be fabricated with a substrate; a gate line that is extended in a first direction on the substrate; a gate electrode that is extended from the gate line; a semiconductor layer that is positioned on the gate electrode; a source electrode and drain electrode that are positioned on the semiconductor layer; a lower electrode that is extended from the drain electrode; a photodiode that is positioned on the lower electrode; a first insulation layer that is positioned on the source electrode and the drain electrode and that includes a first opening that exposes the source electrode; and a data line that is extended in a second direction intersecting the first direction on the first insulation layer to intersect the gate line with the first insulation layer interposed between the data line and the gate line, and the data line being electrically connected to the source electrode through the first opening.

The X-ray detector may further include an intermediate electrical conductor or connection that is positioned between the data line and the source electrode to correspond to the first opening, and the connector electrically connects the data line and the source electrode.

One portion of the intermediate electrical conductor or connection may be positioned at the first opening to contact the source electrode, and another portion of the intermediate electrical conductor or connection may be positioned on the first insulation layer.

The first insulation layer may include a second opening that exposes the lower electrode, and the photodiode may be electrically connected to the lower electrode through the second opening.

The X-ray detector may further include a first diode electrode that is positioned between the lower electrode and the photodiode in order to correspond to the second opening with the first diode electrode electrically connecting the lower electrode and the photodiode. The X-ray detector may also include a second diode electrode that is positioned on the photodiode.

One portion of the first diode electrode may be positioned at the second opening to contact the lower electrode, and the other portion of the first diode electrode may be positioned on the first insulation layer.

The first diode electrode may be formed from the same layer as the intermediate electrical conductor or connection.

The X-ray detector may further include a second insulation layer that is positioned between the first insulation layer and the data line. The second insulation layer includes a third opening that exposes the intermediate electrical conductor or connection into correspondence with correspond to the first opening of the first insulation layer. The data line may be electrically connected to the source electrode through the third opening.

The thickness of the second insulation layer may be larger than that of the first insulation layer.

The second insulation layer may include a fourth opening that exposes the second diode electrode. The bias line is positioned on the second insulation layer and is electrically connected to the second diode electrode through the fourth opening.

The bias line may be formed from the same layer as the data line.

The X-ray detector may further include a third insulation layer that is positioned on the data line and the bias line.

The thickness of the third insulation layer may be larger than that of the first insulation layer.

The X-ray detector may further include a planarization layer that is positioned on the to third insulation layer.

The X-ray detector may further include a scintillator layer that is positioned on the planarization layer. The scintillator layer converts X-rays that are applied from the outside into visible rays.

At an intersecting portion of (or an intersection between) the gate line and the data line, a distance between the gate line and the data line may be in a range of from 500 Å to 25,000 Å.

As described above, according to the exemplary embodiment, the occurrence of electrical noise is minimized in a wire, and an X-ray detector having improved DQE is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The exemplary embodiment will be described more fully hereinafter with reference to the accompanying drawings, in which an exemplary embodiment is shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in the drawings, the size and thickness of each element are randomly represented for better understanding and ease of description, and the exemplary embodiment is not limited thereto.

In the drawings, the thickness of layers, films, panels, regions, etc., are exaggerated for clarity. In the drawings, for better understanding and ease of description, thicknesses of some layers and areas are excessively displayed. When it is said that any part, such as a layer, film, region, or plate, is positioned on another part, it means the part is directly on the other part or above the other part with at least one intermediate part.

In addition, in the specification, unless explicitly described to the contrary, the word "comprise" and variations such as "comprises" or "comprising" will be understood to imply the inclusion of stated elements but not the exclusion of any other elements. Further, in the specification, a statement regarding an upper part of a target portion indicates an upper part or a lower part of a target portion, rather than the target portion always being positioned at the upper side based on a gravity direction.

In an X-ray detector, when X-rays that are emitted from an X-ray source pass through an object undergoing inspection (i.e., a workpiece), a scintillator that is provided in the X-ray detector converts the X-rays that passed the workpiece through in accordance with density of the inspection object into visible rays. Thereafter, a photodiode that is provided in the X-ray detector converts the visible rays into an electrical signal based on the visible rays that have been converted from the X-ray by the scintillator, and the X-ray detector is thus able to display a digital image of the workpiece through which the X-rays have passed by using the converted electrical signal.

A main index representing performance of the X-ray detector is known as the detective quantum efficiency (DQE). That is, performance of the X-ray detector may be determined in accordance with how minutely a quantum can be detected in during constant conditions of photograph.

The value of the DQE varies according to model or specification of the X-ray detector. Particularly, in order to improve the DQE, electrical noise should be minimized from occurring in a wire or lead or electrical conductor or electrical trance or electrode that is provided in the X-ray detector.

The information above disclosed is only for enhancement of understanding of the background of the described technology and therefore it may contain information that does not form the prior art that is already known in this country to a person of ordinary skill in the art.

Hereinafter, an X-ray detector 1000 constructed as an exemplary embodiment of the present invention will be described with reference to FIGS. 1 through 4.

Figure 1:
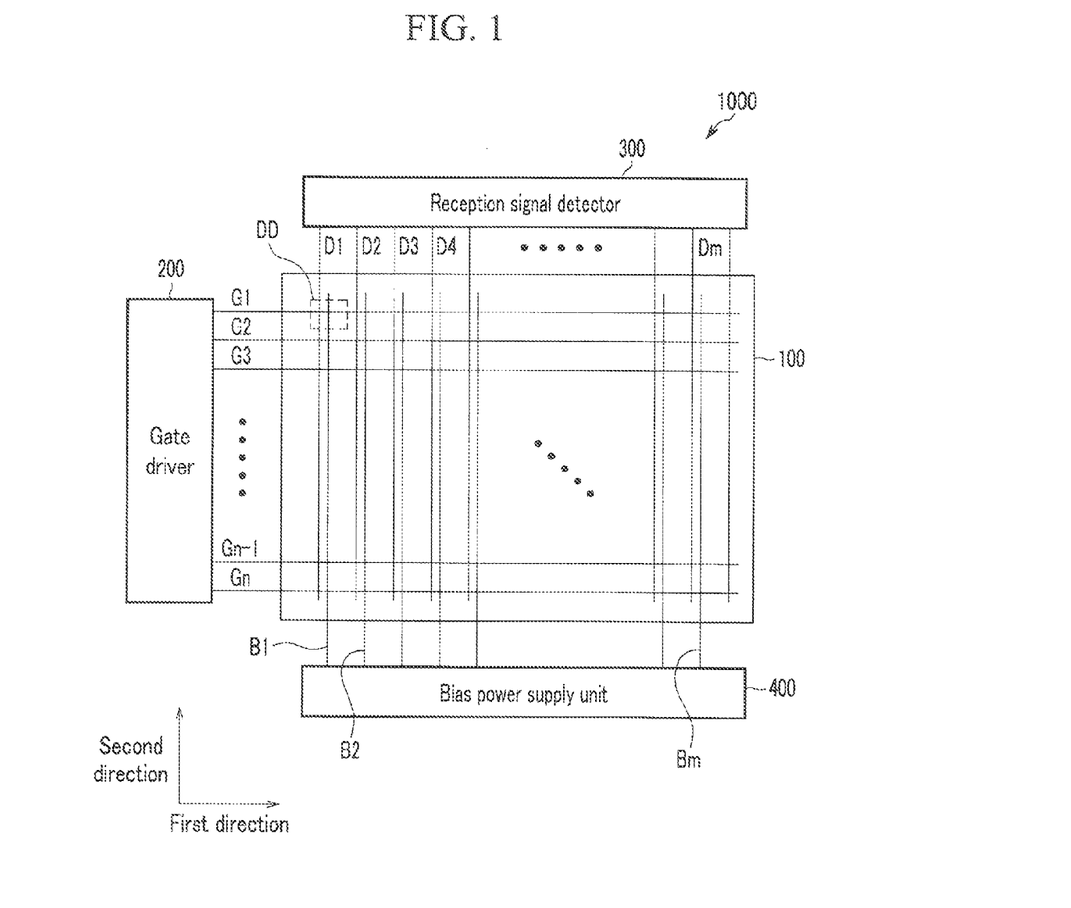
FIG. 1 is a schematic block diagram illustrating an X-ray detector constructed as an exemplary embodiment of the present invention.

FIG. 1 is a block diagram illustrating an X-ray detector constructed as an exemplary embodiment.

As shown in FIG. 1, the X-ray detector 1000 constructed as an exemplary embodiment includes an X-ray detection panel 100, a gate driver 200, a reception signal detector 300, and a bias power supply unit 400.

The X-ray detection panel 100 includes unit detection elements DD that are arranged in an approximate matrix form and a plurality of signal lines G1-Gn, D1-Dm, and B1-Bm that are connected to the unit detection elements DD.

The unit detection element DD includes a thin film transistor TFT and a photodiode Pd. A PIN diode may be used as the photodiode. Hereinafter, a case where a PIN diode is used as the photodiode is exemplified. The unit detection element DD will be described in FIG. 2.

The signal lines G1-Gn, D1-Dm, and B1-Bm include a plurality of gate lines G1-Gn that transfer a gate signal from the gate driver 200, a plurality of data lines D1-Dm that transfer a signal that is detected in the photodiode to the reception signal detector 300, and bias lines B1-Bm that apply a bias voltage to each photodiode. The gate lines G1-Gn are extended in a first direction, which is substantially a row direction, and the neighboring gate lines G1-Gn are substantially parallel. The data lines D1-Dm and the bias lines B1-Bm are extended in a second direction, which is substantially a column direction, and the neighboring data lines D1-Dm and bias lines B1-Bm are substantially parallel.

A detailed structure of the X-ray detection panel 100 will be described later with reference to FIGS. 3 and 4.

The gate driver 200 is connected to the gate lines G1-Gn of the X-ray detection panel 100. A gate signal is applied to the gate electrode of the thin film transistor that is disposed on the inside of the unit detection element DD. The gate signal is a signal for controlling the operational steps of turning-on or turning-off of the thin film transistor TFT, and the gate signal is transmitted to the gate electrode through the gate lines G1-Gn. The gate signal includes a gate-on voltage Von signal for turning on the thin film transistor TFT and a gate-off voltage Voff is signal for turning off the thin film transistor TFT. The gate driver 200 sequentially applies a gate-on voltage Von signal to each of a plurality of gate lines G1-Gn and applies a gate-off voltage Voff signal to each of the plurality of gate lines G1-Gn in a time period during which the gate-on voltage Von is not applied.

The reception signal detector 300 is electrically connected to data lines D1-Dm of the X-ray detection panel 100 and the reception signal detector 300 performs a function of receiving an electrical signal that is detected in the photodiode Pd. The reception signal detector 300 collects an electrical signal that is detected in the photodiode Pd for a gate-on time period at a capacitor (not shown) that is connected to an operational amplifier (not shown). The reception signal detector 300 transmits the electrical signal to a shift register (not shown) and stores the electrical signal for a gate-on time period of at least one time and transmits the electrical signal to an AD converter (not shown). The electrical signal that is transmitted to the AD converter (not shown) is converted to a digital signal to be output. The final output digital signal is displayed on a digital screen.

The bias power supply unit 400 is electrically connected to the bias lines B1-Bm of the X-ray detection panel 100, and the bias power supply unit 400 applies a bias voltage to the photodiode Pd. The photodiode Pd to which a bias voltage is applied may detect visible rays that are converted by the scintillator from X-rays that are emitted by an X-ray source and pass though an inspection object and the photodiode Pd may generate an electric current, and the electric current is an electrical signal corresponding to the detected visible rays. When a bias voltage is not applied to the photodiode Pd, even if visible rays are applied to the photodiode Pd, the photodiode Pd does not generate an electric current and thus does not perform a function of a photodiode.

At least one of the gate driver 200, the reception signal detector 300, and the bias power supply unit 400 may be integrated and mounted on the X-ray detection panel 100 in a form of an integrated circuit chip, may be mounted on a flexible printed circuit (FPC) film to be attached to the X-ray detection panel 100 in a form of a tape carrier package (TCP), may be mounted on a separate printed circuit board, or may be integrated in the X-ray detection panel 100 together with the signal lines G1-Gn, D1-Dm, and B1-Bm and the thin film transistor TFT. Further, the gate driver 200, the reception signal detector 300, and the bias power supply unit 400 may be integrated as a single chip, and in this case, at least one of them or at least one circuit element constituting them may be disposed at the outside of a single chip. In one embodiment, the gate driver 200, the reception signal detector 300, and the bias power supply unit 400 may be integrally formed simultaneously and together on a single chip.

Hereinafter, the unit detection element DD will be described in detail with reference to FIG. 2.

Figure 2:
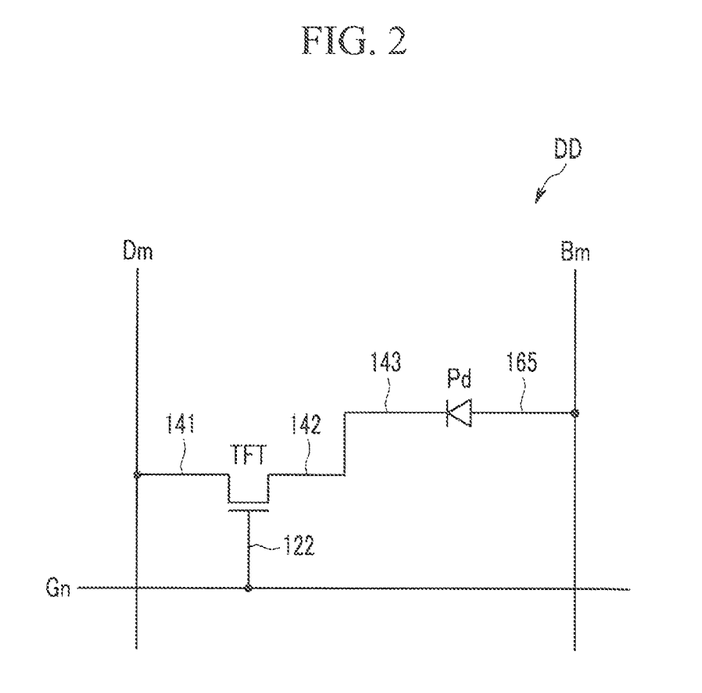
FIG. 2 is a circuit diagram illustrating a unit detection element that is shown in FIG. 1.

FIG. 2 is a circuit diagram illustrating a unit detection element DD that is shown in FIG. 1.

As shown in FIG. 2, the unit detection element DD includes a photodiode (Pd) and a thin to film transistor (TFT).

The Pd performs a function of a light sensor that detects light. A scintillator 189 (shown in FIG. 4) is positioned on the TFT and the Pd. The scintillator 189 is made of a material that emits light by colliding with radiated rays, and when X-rays that are transmitted through an inspection object are applied to the scintillator 189, the scintillator 189 converts the X-rays to light of a visible ray region and emits the visible ray. Visible rays that are emitted through the scintillator 189 are detected by the Pd, which is a light sensor, and the visible rays are converted to an electrical signal, which may be an electric current. In this case, the photodiode Pd receives a bias voltage through the bias line Bm from the bias power supply unit 400 to detect visible rays and to convert the visible rays detected to an electrical signal.

The TFT transmits an electrical signal that is detected and converted in the photodiode Pd to the reception signal detector 300 through the data line Dm in response to a gate signal that is supplied from the gate driver 200 to the gate electrode of the TFT through the gate line Gn.

Hereinafter, a structure of the X-ray detection panel 100 will be described in detail with reference to FIGS. 3 and 4.

Figure 3:
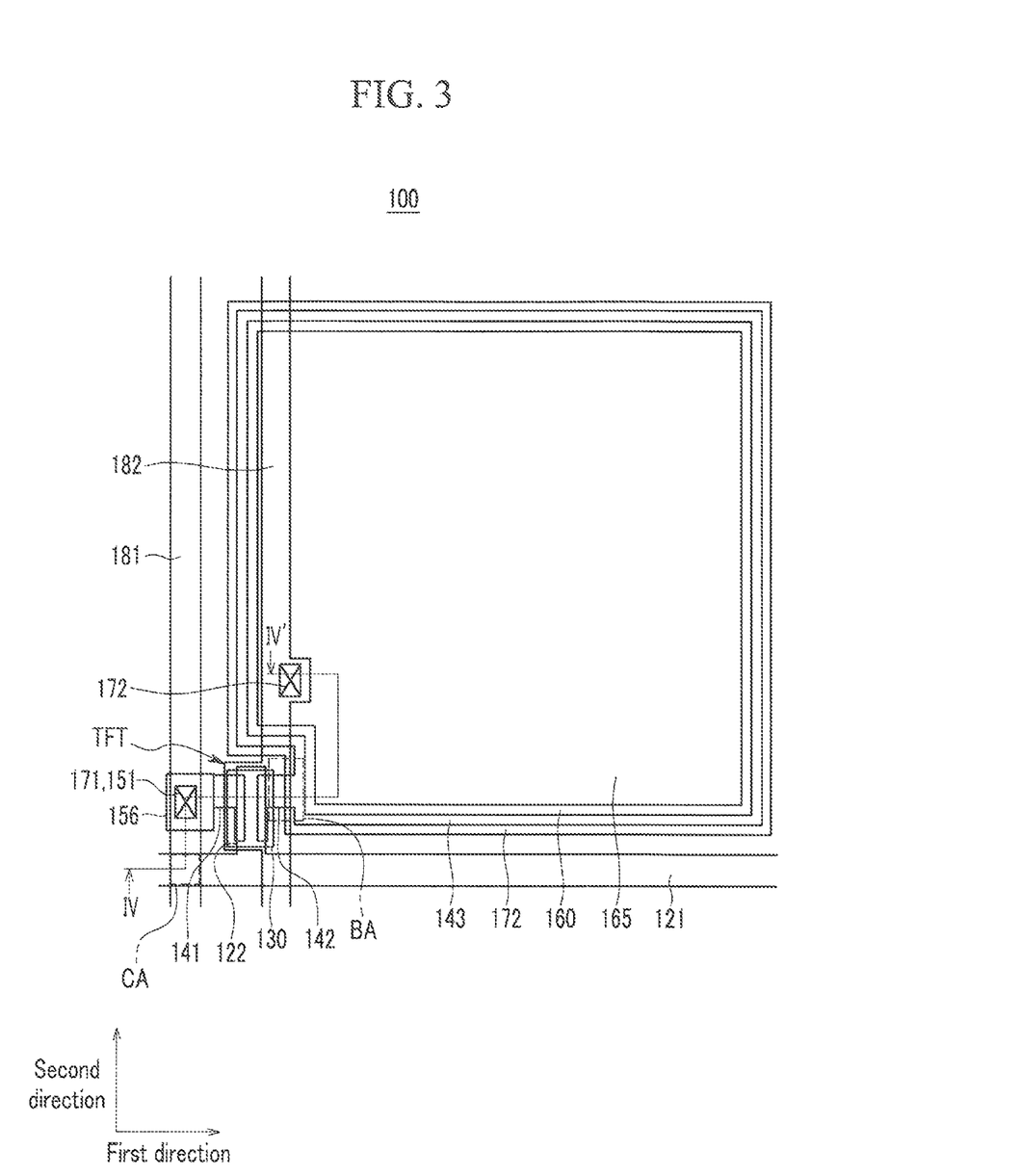
FIG. 3 is a layout view illustrating an X-ray detection panel including the unit detection element that is shown in FIG. 2.

FIG. 3 is a layout view illustrating an X-ray detection panel 100 based on the unit detection element DD that is shown in FIG. 2. FIG. 4 is a cross-sectional view illustrating the X-ray detection panel taken along line IV-IV' of FIG. 3.

Figure 4:
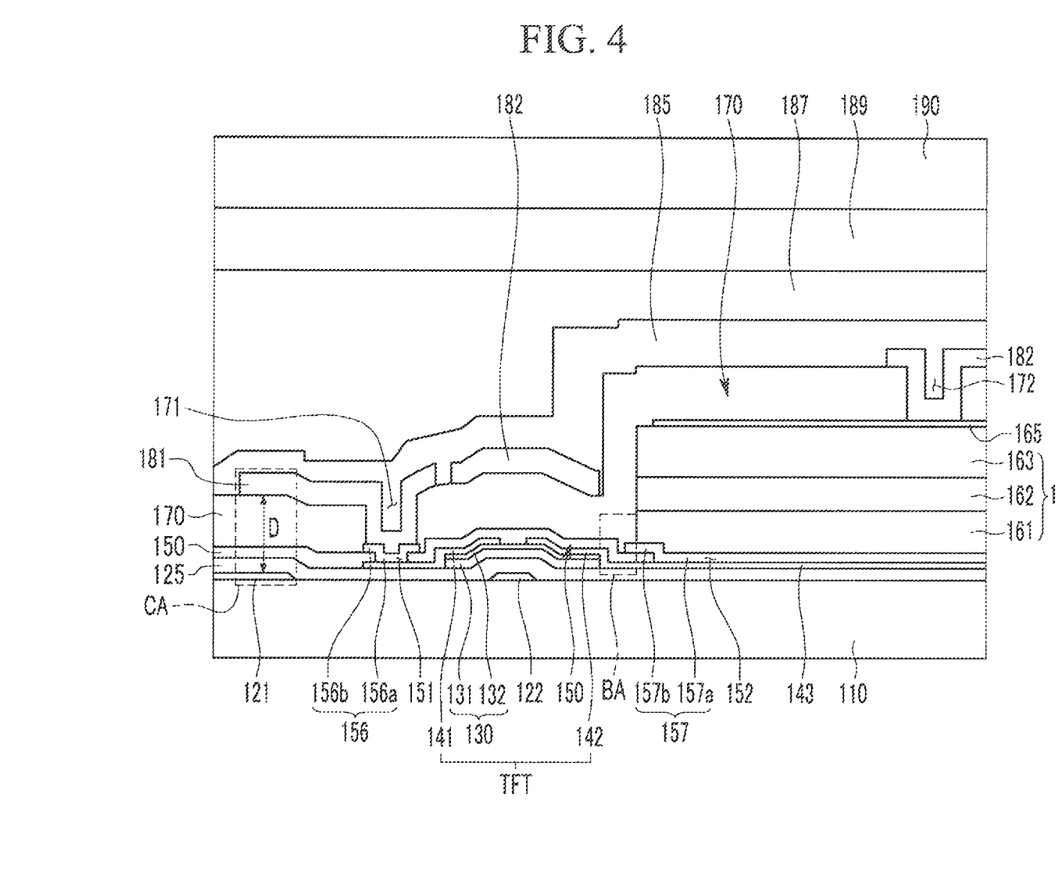
FIG. 4 is a cross-sectional view illustrating the X-ray detection panel taken along line IV-IV' of FIG. 3.

As shown in FIGS. 3 and 4, the X-ray detection panel 100 of the X-ray detector 1000 constructed as an exemplary embodiment includes a first substrate 110, a gate line 121, a gate electrode 122, a gate insulating layer 125, a semiconductor layer 130, a source electrode 141, a drain electrode 142, a lower electrode 143, a first insulation layer 150, an intermediate electrical conductor or connection 156, a first diode electrode 157, a photodiode 160, a second diode electrode 165, a second insulation layer 170, a data line 181, a bias line 182, a third insulation layer 185, a planarization layer 187, a scintillator 189, and a second substrate 190.

The first substrate 110 is made of transparent glass or plastic. The gate line 121 is positioned on the first substrate 110, and a buffer layer (not shown) is positioned between the gate line 121 and the first substrate 110.

The gate line 121 extends in a first direction on the first substrate 110 and transfers a gate signal to the gate electrode of the TFT. The gate electrode 122 is extended from the gate line 121. In one embodiment, the gate electrode 122 and the gate line 121 may be integrally formed simultaneously and together as a single, monolithic structure.

The gate electrode 122 forms a TFT and receives a gate signal through the gate line 121. The gate line 121 and the gate electrode 122 may be integrally formed, and may include a conductive layer of a single layer or a multiple layer including at least one of aluminum (Al), chromium (Cr), molybdenum (Mo), copper (Cu), titanium (Ti), neodymium (Nd), tungsten (W), gold (Au), and silver (Ag). The gate insulating layer 125 is formed on the gate line 121 and the gate electrode 122. In one embodiment, the gate insulating layer 125 may completely cover the gate line 121 and the gate electrode 122.

The gate insulating layer 125 electrically insulates the gate electrode 122 from the semiconductor layer 130, and the gate insulating layer 125 may include an electrical insulation layer of a single layer or a multiple layer including at least one of silicon nitride (SiNx) and silicon oxide (SiOx). The semiconductor layer 130 may be positioned on the gate insulating layer 125 to correspond to the gate electrode 122.

The semiconductor layer 130 forms a TFT, and includes an active layer 131 and a resistance contact layer 132. The active layer 131 is positioned on the gate insulating layer 125, and includes a semiconductor material such as hydrogenated amorphous silicon or polysilicon. It is preferable that the active layer 131 is formed to have an area that can cover both ends of the gate electrode 122. The resistance contact layer 132 is positioned on the active layer 131, and includes a material such as silicide or n+ hydrogenated amorphous silicon in which n-type impurities such as phosphorus (P) are doped in a high concentration. The resistance contact layer 132 is positioned between the active layer 131 and the source electrode 141 and drain electrode 142, and reduces electrical contact resistance of each of between the active layer 131 and the source electrode 141 and between the active layer 131 and the drain electrode 142.

The source electrode 141 may be positioned on the left side of the resistance contact layer 132 as shown in FIG. 4, and the drain electrode 142 may be positioned on the right side of the resistance contact layer 132. The source electrode 141 and the drain electrode 142 form a TFT and both are positioned to be divided about the gate electrode 122. The source electrode 141 and the drain electrode 142 may be respectively disposed on two opposite sides of the gate electrode 122 as shown in FIG. 4. The source electrode 141 and the drain electrode 142 may include a conductive layer of a single layer or a multiple layer including at least one of aluminum (Al), chromium (Cr), molybdenum (Mo), copper (Cu), titanium (Ti), neodymium (Nd), tungsten (W), gold (Au), and silver (Ag). The source electrode 141 has a height difference from the data line 181 and the first substrate 110, and the source electrode 141 is electrically connected to the data line 181 through a first opening 151 of the first insulation layer 150 and a third opening 171 of the second insulation layer 170 to be described later. The lower electrode 143 is extended from the drain electrode 142. In one embodiment, the lower electrode 143 and the drain electrode 142 may be integrally formed simultaneously and together as a single, monolithic structure.

The lower electrode 143 is extended from the drain electrode 142 to be extended to an area corresponding to the photodiode 160. That is, the lower electrode 143 is formed from a partial area of the semiconductor layer 130 forming the TFT to the area at which the photodiode 160 is disposed.

The first insulation layer 150 is positioned on the source electrode 141 and the drain electrode 142, and the first insulation layer 150 may include an insulation layer of a single layer or a multiple layer including at least one of silicon nitride (SiNx) and silicon oxide (SiOx). The first insulation layer 150 includes a first opening 151 that exposes at least a portion of the source electrode 141, and a second opening 152 that exposes at least a portion of the lower electrode 143. The data line 181 is connected to the source electrode 141 through the first opening 151 of the first insulation layer 150, and the photodiode 160 is connected to the lower electrode 143 through the second opening 152 of the first insulation layer 150. The intermediate electrical conductor or connection 156 is positioned on the source electrode 141 to correspond to the first opening 151 of the first insulation layer 150, and the first diode electrode 157 is positioned on the lower electrode 143 to correspond to the second opening 152. In one embodiment, the connector 156 may be disposed on the source electrode 141 to completely cover the first opening 151 of the first insulation layer 150, and the first diode electrode 157 may be disposed on the lower electrode 143 to completely cover the second opening 152.

The intermediate electrical conductor or connection 156 is positioned to correspond to the first opening 151, and is positioned between the source electrode 141 and the data line 181. The intermediate electrical conductor or connection 156 electrically connects the source electrode 141 to the data line 181. One portion 156a of the intermediate electrical conductor or connection 156 is positioned at the first opening 151 to contact with the source electrode 141, and another portion 156b of the connector 156 is extended from the one portion 156a to be positioned on the first insulation layer 150. The intermediate electrical conductor or connection 156 assists an electrical connection between the source electrode 141 and the data line 181.

The first diode electrode 157 is positioned to correspond to the second opening 152, and is positioned between the lower electrode 143 and the photodiode 160. The first diode electrode 157 electrically connects the lower electrode 143 to the photodiode 160. One portion 157a of the first diode electrode 157 is positioned at the second opening 152 to contact the lower electrode 143, and another portion 157b of the first diode electrode 157 is extended from the one portion 157a to be positioned on the first insulation layer 150. The first diode electrode 157 and the intermediate electrical conductor or connection 156 are formed from the same layer, and may include a conductive layer of a single layer or a multiple layer including at least one of aluminum (Al), chromium (Cr), molybdenum (Mo), copper (Cu), titanium (Ti), neodymium (Nd), tungsten (W), gold (Au), and silver (Ag). That is, the first diode electrode 157 and the intermediate electrical conductor or connection 156 may be formed by using a microelectromechanical systems (MEMS) process such as a photolithography process from one conductive layer.

In this way, as the other portion 157b of the first diode electrode 157 is positioned on the first insulation layer 150, the first insulation layer 150 is positioned between the lower electrode 143 and the first diode electrode 157 that is connected to the photodiode 160, therefore, electrical noise that is generated in the drain electrode 142 may be minimized by an electron trap phenomenon that is generated in the photodiode 160.

More specifically, in a conventional X-ray detector, electrical noise is generally generated in the drain electrode by an electron trap phenomenon that is generated in a boundary area of the photodiode. On the other hand, in the X-ray detector 1000 constructed as an exemplary embodiment of the present invention, as the first insulation layer 150 is positioned at is a boundary area (BA) of the photodiode 160, the first insulation layer 150 may stop an electron trap phenomenon that is generated in the photodiode 160 and thus electrical noise that is generated in the drain electrode 142 may be minimized. Consequently, the DQE of the X-ray detector 1000 is advantageously improved. The boundary area (BA) refers to an area interposed between the photodiode 160 and the semiconductor layer 130 of the thin film transistor TFT.

Furthermore, in the X-ray detector 1000 constructed as an exemplary embodiment, the first diode electrode 157 is formed adjacent to the gate electrode 122, and the gate electrode 122 and the first diode electrode 157 are not overlapped by the first insulation layer 150, and thus a disposition area of the photodiode 160 may be maximized. Thereby, a fill factor of the photodiode 160 that changes visible rays to an electrical signal may be highly embodied. When the fill factor of the photodiode 160 increases, light detection efficiency of the photodiode 160 increases, therefore, the DQE of the X-ray detector 1000 may be improved.

The photodiode 160 may be positioned on the first diode electrode 157. In one embodiment, the photodiode 160 may be directly disposed on the first diode electrode 157, and the photodiode 160 may be in immediate contact with the first diode electrode 157.

The photodiode 160 is positioned on the lower electrode 143, and an N-type semiconductor 161, an intrinsic semiconductor 162, and a P-type semiconductor 163 are sequentially stacked. The second diode electrode 165 is positioned on the photodiode 160.

In one embodiment, the photodiode 160 is disposed directly on the lower electrode 143, and an N-type semiconductor 161, an intrinsic semiconductor 162, and a P-type semiconductor 163 may be sequentially stacked. The second diode electrode 165 may be disposed directly on the photodiode 160.

The second diode electrode 165 is formed to have an area corresponding to the photodiode 160, and the second diode electrode 165 is electrically connected to the bias line 182 through a fourth opening 172 of the second insulation layer 170 to be described later. The second diode electrode 165 may include a transparent conductive material such as indium tin oxide (ITO) or indium zinc oxide (IZO). The second insulation layer 170 may be positioned on the second diode electrode 165.

The second insulation layer 170 is positioned between the first insulation layer 150 and the data line 181. The thickness of the second insulation layer 170 is larger than that of the first insulation layer 150, and the second insulation layer 170 includes an insulation layer of a single layer or a multiple layer including at least one of silicon nitride (SiNx) and silicon oxide (SiOx). The second insulation layer 170 includes a third opening 171 that exposes the intermediate electrical conductor or connection 156 to correspond to the first opening 151 of the first insulation layer 150 and the fourth opening 172 that exposes the second diode electrode 165. The data line 181 is electrically connected to the source electrode 141 through the first opening 151 of the first insulation layer 150 and the third opening 171 of the second insulation layer 170, and the bias line 182 is electrically connected to the second diode electrode 165 through the fourth opening 172 of the second insulation layer 170. The data line 181 and the bias line 182 are positioned on the second insulation layer 170.

The data line 181 is extended in the second direction intersecting the first direction, which is an extension direction of the gate line 121 on the first insulation layer 150 and the second insulation layer 170, and the data line 181 intersects the gate line 121 with the first insulation layer 150 and the second insulation layer 170 disposed between the data line 181 and the gate line 121. That is, the data line 181 is separated from the gate line 121 in a crossing area (CA) where the data line 181 intersects the gate line 121 with the gate insulating layer 125, the first insulation layer 150, and the second insulation layer 170 disposed between the data line 181 and the gate line 121, and the data line 181 is electrically connected to the source electrode 141 through the first opening 151 of the first insulation layer 150 and the third opening 171 of the second insulation layer 170. In the crossing area CA, a distance D between the gate line 121 and the data line 181 may be in a range of from about 500 Å to about 25,000 Å.

In this way, in the crossing area CA, when the distance D between the gate line 121 and the data line 181 increases, power that is accumulated in the gate insulating layer 125, the first insulation layer 150, and the second insulation layer 170 corresponding to the crossing area CA may be minimized by an electric current flowing to each of the gate line 121 and the data line 181. When storage capacity storing power that is accumulated in the crossing area CA is minimized, delay of a data signal or a gate signal, which is an electric current flowing through the data line 181 or the gate line 121, may be minimized. That is, electrical noise that is generated in the data line 181 and the gate line 121 may be minimized, thereby improving the DQE of the X-ray detector 1000.

Furthermore, as the data line 181 is positioned at a layer that is different from that of the source electrode 141 forming a TFT, it is unnecessary to consider the thickness of the source electrode 141 forming the TFT during forming the data line 181; therefore, the thickness or area of the data line 181 may be freely formed. The freely designed thickness of the data line 181 functions as an element that minimizes electrical resistance of the data line 181, and thus delay of a data signal flowing through the data line 181 may be minimized. That is, because electrical noise that is generated in the data line 181 may be minimized, the DQE of the X-ray detector 1000 is improved.

The bias line 182 is separated from the data line 181.

The bias line 182 is extended in the second direction, which is the direction parallel to the data line 181. The bias line 182 is electrically connected to the second diode electrode 165 through the fourth opening 172 of the second insulation layer 170. The bias line 182 and the data line 181 are formed from the same layer, and include a conductive layer of a single layer or a multiple layer including at least one of aluminum (Al), chromium (Cr), molybdenum (Mo), copper (Cu), titanium (Ti), neodymium (Nd), tungsten (W), gold (Au), and silver (Ag). That is, the bias line 182 and the data line 181 may be formed by using a MEMS process such as a photolithography process from one conductive layer. The third insulation layer 185 is positioned on the bias line 182 and the data line 181.

The third insulation layer 185 covers all portions that are exposed at the upper side including the bias line 182, the data line 181, and the photodiode 160. In one embodiment, the third insulation layer 185 may completely cover the bias line 182, the data line 181, and the photodiode 160. The thickness of the third insulation layer 185 may be larger than that of the first insulation layer 150, and the third insulation layer 185 may include an insulation layer of a single layer or a multiple layer including at least one of silicon nitride (SiNx) and silicon oxide (SiOx). The planarization layer 187 is positioned on the third insulation layer 185.

The planarization layer 187 may be formed with an organic layer or an inorganic layer, and the planarization layer 187 covers the third insulation layer 185.

In this way, the third insulation layer 185 covers all portions that are exposed at the upper side, including the bias line 182, the data line 181, and the photodiode 160, and the planarization layer 187 covers the third insulation layer 185, and thus moisture penetration to a portion that is covered by the third insulation layer 185 may be minimized. Particularly, when moisture penetrates to the photodiode 160, photoelectric conversion ability of the photodiode 160 may be deteriorated. When moisture penetration to the photodiode 160 is minimized by the third insulation layer 185, deterioration of the DQE of the X-ray detector 1000 may be minimized.

The scintillator 189 is positioned on the planarization layer 187. The scintillator 189 is made of a material that emits light by colliding with X-rays that transmit through an inspection object from an X-ray source. When X-rays are applied to the scintillator 189, the scintillator 189 converts the X-rays into light of a visible ray area (particularly, green wavelength light) and emits the visible light. The emitted visible rays are applied to the photodiode 160, and the photodiode 160 generates an electric current by converting the visible rays.

The second substrate 190 is positioned on the scintillator 189, and the second substrate 190 is formed to protect the scintillator 189 and a lower structure of the scintillator 189.

As described above, in the X-ray detector 1000 constructed as an exemplary embodiment, electrical noise may be minimized from occurring in a wire such as the source electrode 141, the drain electrode 142, the data line 181, and the gate line 121, thereby improving the DQE.

In the X-ray detector 1000 constructed as an exemplary embodiment of the present invention, the gate insulating layer 125, the first insulation layer 150, and the second insulation layer 170 are positioned between the gate line 121 and the data line 181.

In an X-ray detector constructed as another exemplary embodiment, only a gate insulating layer and a first insulation layer can be positioned between a gate line and a data line. In this case, the data line can be connected to a source electrode through a first opening of the first insulation layer.

Furthermore, in the X-ray detector 1000 constructed as an exemplary embodiment, the data line 181 and the source electrode 141 are electrically connected through the intermediate electrical conductor or connection 156. In the X-ray detector constructed as another exemplary embodiment, a data line and a source electrode may be directly connected by omitting an intermediate electrical conductor or connection.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. An X-ray detector, comprising:
   a substrate;
   a gate line that is extended in a first direction on the substrate;
   a gate electrode that is extended from the gate line;
   a semiconductor layer that is positioned on the gate electrode;
   a source electrode and a drain electrode that are positioned on the semiconductor layer;
   a lower electrode that is extended from the drain electrode;
   a photodiode that is positioned on the lower electrode;
   a first insulation layer that is positioned on the source electrode and the drain electrode and that comprises a first opening that exposes the source electrode;
   a data line that is extended in a second direction intersecting the first direction on the first insulation layer to intersect the gate line with the first insulation layer interposed between the data line and the gate line, and the data line being electrically connected to the source electrode through the first opening; and a connection that is positioned between the data line and the source electrode to correspond to the first opening and that electrically connects the data line and the source electrode, the connection having a flange overlapping the first insulation layer and overlapping a contiguous portion of the data line.

2. The X-ray detector of claim 1, wherein one portion of the connection is positioned at the first opening to contact the source electrode, and another portion of the connection is positioned on the first insulation layer.

3. The X-ray detector of claim 1, wherein the first insulation layer comprises a second opening that exposes the lower electrode, and the photodiode is electrically connected to the lower electrode through the second opening.

4. The X-ray detector of claim 3, further comprising:
a first diode electrode that is positioned between the lower electrode and the photodiode to correspond to the second opening and that electrically connects the lower electrode and the photodiode; and
a second diode electrode that is positioned on the photodiode.

5. The X-ray detector of claim 4, wherein one portion of the first diode electrode is positioned at the second opening to contact the lower electrode, and the other portion of the first diode electrode is positioned on the first insulation layer.

6. The X-ray detector of claim 4, wherein the first diode electrode is formed from a same layer as the connection.

7. The X-ray detector of claim 4, further comprising a second insulation layer that is positioned between the first insulation layer and the data line, and the second insulation layer comprising a third opening that exposes the connection to correspond to the first opening of the first insulation layer, wherein the data line is electrically connected to the source electrode through the third opening.

8. The X-ray detector of claim 7, wherein a thickness of the second insulation layer is larger than that of the first insulation layer.

9. The X-ray detector of claim 7,
wherein the second insulation layer further comprises a fourth opening that exposes the second diode electrode, and
wherein a bias line is positioned on the second insulation layer and is electrically connected to the second diode electrode through the fourth opening.

10. The X-ray detector of claim 9, wherein the bias line is formed from a same layer as the data line.

11. The X-ray detector of claim 10, further comprising a third insulation layer that is positioned on the data line and the bias line.

12. The X-ray detector of claim 11, wherein a thickness of the third insulation layer is larger than that of the first insulation layer.

13. The X-ray detector of claim 11, further comprising a planarization layer that is positioned on the third insulation layer.

14. The X-ray detector of claim 13, further comprising a scintillator layer that is positioned on the planarization layer and that converts X-rays that are applied from an exterior of the X-ray detector into visible rays.

15. The X-ray detector of claim 1, wherein at an intersecting portion of the gate line and the data line, a distance between the gate line and the data line is in a range from 500 Å to 25,000 Å.

16. An X-ray detector, comprising:
a substrate;
a gate line that is extended in a first direction on the substrate;
a gate electrode that is extended from the gate line;
a semiconductor layer that is positioned on the gate electrode;
a source electrode and a drain electrode that are positioned on the semiconductor layer;
a lower electrode that is extended from the drain electrode;
a photodiode that is positioned on the lower electrode;
a first insulation layer that is positioned on the source electrode and the drain electrode and that comprises a first opening that exposes the source electrode, the first insulation layer comprising a second opening that exposes the lower electrode, and the photodiode electrically connected to the lower electrode through the second opening;
a data line that is extended in a second direction intersecting the first direction on the first insulation layer to intersect the gate line with the first insulation layer interposed between the data line and the gate line, and the data line being electrically connected to the source electrode through the first opening;
a connection that is positioned between the data line and the source electrode to correspond to the first opening and that electrically connects the data line and the source electrode;
a first diode electrode that is positioned between the lower electrode and the photodiode to correspond to the second opening and that electrically connects the lower electrode and the photodiode; and
a second diode electrode that is positioned on the photodiode,
with the first diode electrode being formed from a same layer as the connection and being formed of a same material as that of the connection.

* * * * *